US012610776B2

(12) United States Patent
Park et al.

(10) Patent No.: US 12,610,776 B2
(45) Date of Patent: Apr. 21, 2026

(54) SUBSTRATE PROCESSING APPARATUS, SUBSTRATE PROCESSING METHOD, AND METHOD OF MANUFACTURING SEMICONDUCTOR DEVICE

(71) Applicant: Samsung Electronics Co., Ltd., Suwon-si (KR)

(72) Inventors: Sangjine Park, Suwon-si (KR); Jihwan Park, Suwon si (KR); Kuntack Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 222 days.

(21) Appl. No.: 18/407,631

(22) Filed: Jan. 9, 2024

(65) Prior Publication Data
US 2024/0242985 A1 Jul. 18, 2024

(30) Foreign Application Priority Data

| Jan. 18, 2023 | (KR) | 10-2023-0007459 |
| Mar. 20, 2023 | (KR) | 10-2023-0036157 |

(51) Int. Cl.
| *H10P 72/00* | (2026.01) |
| *G03F 7/00* | (2006.01) |
| *H10P 76/20* | (2026.01) |

(52) U.S. Cl.
CPC ...... *H10P 72/0474* (2026.01); *G03F 7/70033* (2013.01); *H10P 72/0408* (2026.01);
(Continued)

(58) Field of Classification Search
CPC ........... H01L 21/67225; H01L 21/0274; G03F 7/70033
See application file for complete search history.

(56) References Cited

U.S. PATENT DOCUMENTS

| 7,061,582 B2 * | 6/2006 | Zinn | G03F 7/70116 |
| | | | 355/75 |
| 10,197,333 B2 | 2/2019 | Kim et al. | |

(Continued)

FOREIGN PATENT DOCUMENTS

| KR | 20150089100 A * | 8/2015 | F21V 29/00 |
| KR | 10-1590906 B1 | 2/2016 | |

(Continued)

*Primary Examiner* — Minh Q Phan
(74) *Attorney, Agent, or Firm* — Muir Patent Law, PLLC

(57) ABSTRACT

Provided is a substrate processing apparatus including an index module including a load port in which a substrate is accommodated, a first transfer module and a second transfer module for loading and unloading the substrate, and a processing module that is connected to the index module and includes a plurality of process chambers that process the substrate, wherein one of the plurality of process chambers includes a light processing chamber configured to irradiate light to a photoresist pattern of the substrate, the first transfer module transfers the substrate between the index module and the processing module, the second transfer module transfers the substrate between the plurality of process chambers in the processing module, the first transfer module includes a first hand unit and a second hand unit, and the second transfer module includes a third hand unit and a fourth hand unit.

20 Claims, 22 Drawing Sheets

300

(52) U.S. Cl.
CPC ...... *H10P 72/0411* (2026.01); *H10P 72/0448*
(2026.01); *H10P 76/2041* (2026.01)

(56) References Cited

U.S. PATENT DOCUMENTS

| | | | |
|---|---|---|---|
| 10,354,892 B2 | 7/2019 | Verhaverbeke et al. | |
| 11,527,399 B2 | 12/2022 | Cho et al. | |
| 2015/0348805 A1* | 12/2015 | Kim | H01L 21/67017 |
| | | | 156/345.18 |
| 2020/0388484 A1* | 12/2020 | Cho | H01L 21/67115 |
| 2021/0013064 A1 | 1/2021 | Yoon et al. | |
| 2022/0075268 A1 | 3/2022 | Jeong et al. | |
| 2022/0254658 A1 | 8/2022 | Fukui et al. | |
| 2023/0078946 A1* | 3/2023 | Grzeskowiak | G03F 7/325 |
| | | | 430/30 |

FOREIGN PATENT DOCUMENTS

| | | | |
|---|---|---|---|
| KR | 10-1681190 B1 | 12/2016 | |
| KR | 10-2375576 B1 | 3/2022 | |
| KR | 10-2022-0073991 A | 6/2022 | |

* cited by examiner

1

SUBSTRATE PROCESSING APPARATUS, SUBSTRATE PROCESSING METHOD, AND METHOD OF MANUFACTURING SEMICONDUCTOR DEVICE

CROSS-REFERENCE TO RELATED APPLICATION

This application is based on and claims priority under 35 U.S.C. § 119 to Korean Patent Application Nos. 10-2023-0007459, filed on Jan. 18, 2023, and 10-2023-0036157, filed on Mar. 20, 2023, in the Korean Intellectual Property Office, the disclosures of which are incorporated by reference herein in their entireties.

BACKGROUND

The inventive concept relates to a substrate processing apparatus and a substrate processing method.

Extreme ultra-violet (EUV) lithography methods having a very short wavelength (about 13.5 nm) have been proposed as the miniaturization of semiconductor devices is developed. When such EUV lithography is used, a photoresist pattern having a small horizontal dimension and a high aspect ratio may be formed. In order to prevent collapse of the photoresist pattern in the process of forming the fine photoresist pattern, the technique of using the supercritical fluid is reviewed, but matters to be improved, such as particle defects on the substrate during the manufacturing process of the semiconductor device, still remain.

SUMMARY

According to an aspect of the inventive concept, there is provided a substrate processing apparatus and a substrate processing method capable of reducing particle defects on a substrate by transferring the substrate to each of a plurality of process chambers by using a transfer robot including a plurality of hand units, and improving reliability of the photoresist pattern of the substrate by performing an optical processing process on the substrate.

In addition, the issues to be addressed by the inventive concept are not limited to the tasks mentioned above, and other tasks may be clearly understood by one of ordinary skill in the art from the following description.

Aspects of the inventive concept provide a substrate processing apparatus including a load port on which a container in which a substrate is accommodated is placed, a first transfer module and a second transfer module for loading and unloading the substrate, and a processing module that is connected to the load port and includes a plurality of process chambers that process the substrate, wherein one of the plurality of process chambers includes a light processing chamber configured to radiate light to a photoresist pattern of the substrate to cure the photoresist pattern, and the first transfer module is configured to transfer the substrate between the load port and the processing module, and the second transfer module is configured to transfer the substrate between the plurality of process chambers in the processing module.

Aspects of the inventive concept provide a substrate processing apparatus including a load port configured to receive a container in which a substrate is accommodated, a first transfer module and a second transfer module for loading and unloading the substrate, and a processing module that is connected to the load port and includes a plurality of process chambers that process the substrate, wherein the plurality of process chambers includes a first process chamber, a second process chamber, a third process chamber, a fourth process chamber, a fifth process chamber, and a sixth process chamber, wherein the first process chamber is configured to form a photoresist pattern from a photoresist membrane of the substrate by supplying a developer to the substrate to perform a developing process and a replacement process, the second process chamber is configured to perform a drying process using a supercritical fluid, the third process chamber is configured to perform a cleaning process in which a rinse process is performed, the fourth process chamber is configured to perform a baking process of curing the substrate, the fifth process chamber is configured to perform a light processing process of curing the photoresist pattern by irradiating light to the substrate, the sixth process chamber is configured to perform a cooling process of cooling the substrate processed in the fifth process chamber, the first transfer module is configured to transfer the substrate between the load port and the processing module, the second transfer module is configured to transfer the substrate between the plurality of process chambers in the processing module, the first transfer module includes at least a first hand unit, and the second transfer module includes at least a second hand unit.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
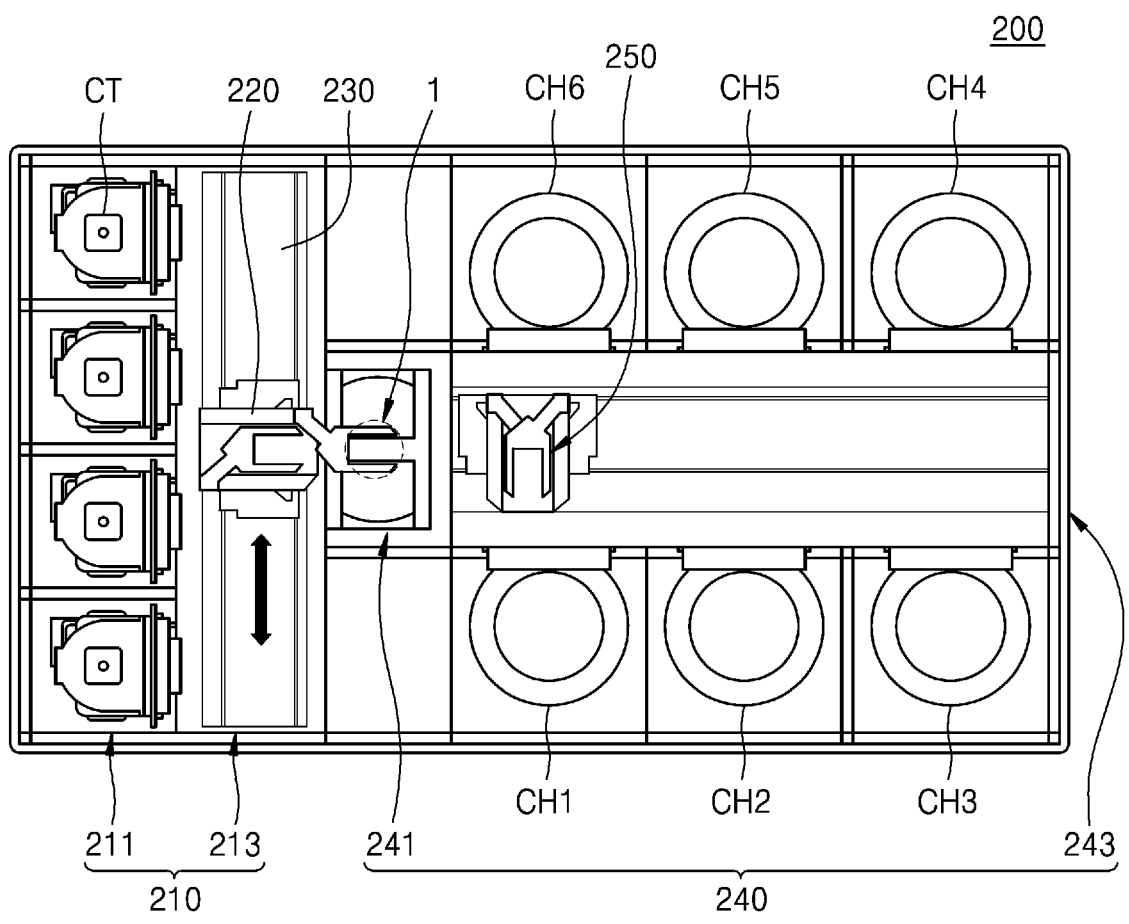
FIG. 1 is a cross-sectional view illustrating a substrate processing apparatus according to embodiments.
Figure 1:
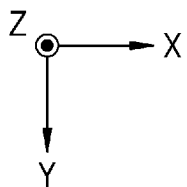

Hereinafter, embodiments of the inventive concept will be described in detail with reference to the accompanying drawings. The same reference numerals are used for the same components in the drawings, and redundant descriptions thereof are omitted.

FIG. 1 is a cross-sectional view illustrating a substrate processing apparatus 200 according to embodiments.

Referring to FIG. 1, the substrate processing apparatus 200 may include an index module 210, a processing module 240, a first transfer module 220, and a second transfer module 250. These various modules may also be described as components, assemblies, or compartments.

The index module 210 may include a load port 211 and a transfer frame 213. The load port 211, the transfer frame 213, and the processing module 240 may be sequentially arranged in a row. Hereinafter, the direction in which the load port 211, the transfer frame 213, and the processing module 240 are arranged in a row is defined as an X direction, the horizontal direction perpendicular to the X direction is defined as a Y direction, and the direction perpendicular to each of the X direction and the Y direction is defined as a Z direction.

A container CT in which the substrate 1 is accommodated is seated on the load port 211. According to embodiments, a plurality of load ports 211 may provided, and may be arranged in a line in the Y direction. Although four load ports 211 are illustrated in the drawing, the number of load ports 211 may increase or decrease according to conditions such as process efficiency and/or installation area of the processing module 240. The container CT may include a plurality of slots configured to support an edge of the substrate 1. The plurality of slots may be spaced apart from each other in the Z direction, and accordingly, a plurality of substrates W may be mounted in the container CT in the Z direction. The container CT may be, for example, a front opening unified pod (FOUP).

The transfer frame 213 may transfer the substrate 1 between the container CT on the load port 211 and a buffer chamber 241 of the processing module 240. The transfer frame 213 may include a first transfer module 220 and an index rail 230. The index rail 230 may extend in the Y direction. The first transfer module 220 is installed on the index rail 230 and may move in a straight line in the Y direction along the index rail 230.

The processing module 240 may include a buffer chamber 241, a transfer chamber 243, and a plurality of process chambers CH1, CH2, CH3, CH4, CH5, and CH6. The plurality of process chambers CH1, CH2, CH3, CH4, CH5, and CH6 may include a first process chamber CH1, a second process chamber CH2, a third process chamber CH3, a fourth process chamber CH4, a fifth process chamber CH5, and a sixth process chamber CH6. The transfer chamber 243 extends in the X direction. In some embodiments, the plurality of process chambers CH1, CH2, CH3, CH4, CH5, and CH6 may be spaced apart in the Y direction with the transfer chamber 243 therebetween. In addition, the plurality of process chambers CH1, CH2, CH3, CH4, CH5, and CH6 may be arranged in the X direction. In some other embodiments, some of the plurality of process chambers CH1, CH2, CH3, CH4, CH5, and CH6 may be stacked in the Z direction. Each process chamber may include an opening or door through which a wafer may pass, which door may face the transfer chamber 243.

In the drawings, the arrangement of the plurality of process chambers CH1, CH2, CH3, CH4, CH5, and CH6 is an example, and the plurality of process chambers CH1, CH2, CH3, CH4, CH5, and CH6 may be variously arranged as necessary. For example, all of the plurality of process chambers CH1, CH2, CH3, CH4, CH5, and CH6 may be arranged only on one side of the transfer chamber 243.

The buffer chamber 241 may be arranged between the transfer frame 213 and the transfer chamber 243. The buffer chamber 241 may provide a space in which a substrate 1 is stored between the transfer chamber 243 and the transfer frame 213. The buffer chamber 241 may include a plurality of slots that are internal spaces in which the substrates 1 are stored. The plurality of slots may overlap and be spaced apart from each other in the Z direction. The buffer chamber 241 may include an opening through which the substrate 1 may enter and exit, in each of a surface facing the transfer frame 213 and a surface facing the transfer chamber 243.

The transfer chamber 243 may transfer the substrate 1 between the buffer chamber 241 and each of the plurality of process chambers CH1, CH2, CH3, CH4, CH5, and CH6. The second transfer module 250 may be located in the transfer chamber 243. The second transfer module 250 may be installed on a rail extending in the X direction and may move in the X direction along the rail. The substrate 1 may be transferred from one to the next among the plurality of process chambers CH1, CH2, CH3, CH4, CH5, and CH6 by the second transfer module 250.

According to embodiments, the first transfer module 220 may include a first hand unit and a second hand unit. The second transfer module 250 may include a third hand unit and a fourth hand unit. The first transfer module 220 may transfer the substrate 1 from the load port 211 to the buffer chamber 241 by using the first hand unit or the second hand unit. The hand units described herein may also be described as grabber arms. Each grabber arm may include an arm configured to move in different directions and a hand or grabber configured to engage with a substrate to lift, support, and hold the substrate while the arm moves. In addition, the second transfer module 250 may transfer, load, and unload the substrate 1 within the processing module 240.

The plurality of process chambers CH1, CH2, CH3, CH4, CH5, and CH6 may sequentially perform semiconductor processes on one substrate 1. For example, after a developing process is performed on the substrate 1 in the first process chamber CH1, a drying process may be performed on the substrate 1 in the second process chamber CH2. Here, the developing process is a process of removing photoresist at a portion exposed (or not exposed) by EUV light during an exposure process. The drying process may be performed by a processing fluid in a supercritical state. In some embodiments, the processing fluid in the supercritical state may include carbon dioxide ($CO_2$).

The first process chamber CH1 may supply a developer to the substrate 1 in a dry state by using a spraying device. In embodiments, the developer may include, for example, a nonpolar organic solvent. In addition, in embodiments, the developer may include a mixture of a nonpolar organic solvent and an acidic solution. In embodiments, the nonpolar organic solvent may include at least one of propylene glycol monomethyl ether acetate (PGMEA), propylene glycol methyl ether (PGME), n-butyl acetate (n-BA), 2-heptanone (MAK), methyl ethyl ketone (MEK), and ethyl pyruvate (EP). The acidic solution may include at least one of acetic acid, hydrochloric acid, sulfuric acid, nitric acid, and hydrofluoric acid.

The developer may be a liquid capable of selectively removing a soluble area of an EUV photoresist. Due to the developer in the first process chamber CH1, the substrate 1 in a dry state may become the substrate 1 in a wet state. A plurality of first process chambers CH1 may be arranged in the processing module 240, and the number of first process chambers CH1 may increase or decrease according to conditions such as process efficiency and/or installation area of the processing module 240.

In addition, the first process chamber CH1 may supply a replacement solution that replaces the developer to the substrate 1 by using a spraying device. Here, the replacement solution may include a nonpolar organic solvent. For example, the replacement solution may include n-butyl acetate (n-BA). The developer may be replaced with the replacement solution (e.g., removed and/or replaced, for example, by physically displacing, dissolving, and/or diluting the developer using the replacement solution).

The second process chamber CH2 may receive the substrate 1 from the first process chamber CH1 in a state in which the developer has been replaced with the replacement solution, and remove the replacement solution on the transferred substrate 1 using a supercritical fluid. Conventionally, a method of rotating the substrate 1 at a high speed has been used, but the EUV photoresist pattern may collapse due to surface tension during high-speed rotation. In order to address this issue, the replacement solution is sprayed to the substrate 1 in the first process chamber CH1, thereby facilitating the removal of the developer and residue by the supercritical fluid. In this way, the substrate 1 may be dried by removing the developer replaced with the replacement solution and the supercritical fluid together from the substrate 1. Due to the drying process in the second process chamber CH2, the substrate 1 in the wet state may become the substrate 1 in the dry state. A plurality of second process chambers CH2 may be arranged in the processing module 240, and the number of second process chambers CH2 may increase or decrease according to conditions such as process efficiency and/or installation area of the processing module 240.

The third process chamber CH3 may be configured to perform an edge cleaning process on the photoresist pattern formed in the substrate by supplying a rinse solution to an edge area of the substrate. In embodiments, the rinse solution may include an acidic solution. In addition, in embodiments, the rinse solution may include a mixture of a nonpolar organic solvent and an acidic solution. In embodiments, the nonpolar organic solvent may include at least one of propylene glycol monomethyl ether acetate (PGMEA), propylene glycol methyl ether (PGME), n-butyl acetate (n-BA), 2-heptanone (MAK), methyl ethyl ketone (MEK), and ethyl pyruvate (EP). The acidic solution may include at least one of acetic acid, hydrochloric acid, sulfuric acid, nitric acid, and hydrofluoric acid.

In embodiments, the third process chamber CH3 may primarily supply the rinse solution to an edge area of the substrate. The third process chamber CH3 may primarily (e.g., initially) supply the rinse solution to the edge area of the substrate and then secondarily (e.g., subsequently) supply the rinse solution to a rear area of the substrate. After performing the supercritical process as described above, a substrate processing apparatus of the inventive concept may perform a cleaning process using a rinse solution in a chamber (for example, the third process chamber CH3) different from a chamber (for example, the second process chamber CH2) in which the supercritical process has been performed. Accordingly, organic matter and/or residue remaining on the photoresist pattern of the substrate may be removed.

The fourth process chamber CH4 may receive the substrate 1 from the third process chamber CH3 and perform a baking process to completely dry the substrate 1. In a hot plate in the fourth process chamber CH4, the substrate 1 may be baked at a temperature of about 120° C. to about 170° C. for about 30 seconds to about 120 seconds. Due to the baking process in the fourth process chamber CH4, the substrate 1 may be maintained in a dry state.

The fifth process chamber CH5 may receive the substrate 1 from the fourth process chamber CH4 and irradiate the substrate 1 with light to perform a light processing process. Here, the fifth process chamber CH5 may be a light processing chamber. The fifth process chamber CH5 may be configured to cure the photoresist pattern by radiating light to the photoresist of the substrate. The fifth process chamber CH5 will be described later with reference to FIGS. 2A and 2B.

The sixth process chamber CH6 may receive the substrate 1 from the fifth process chamber CH5 and perform a cooling process thereon to lower the temperature of the substrate 1. A cooling process may be performed in a cooling plate in the sixth process chamber CH6. Due to the cooling process in the sixth process chamber CH6, the substrate 1 may be maintained in a dry state.

Figure 2A:
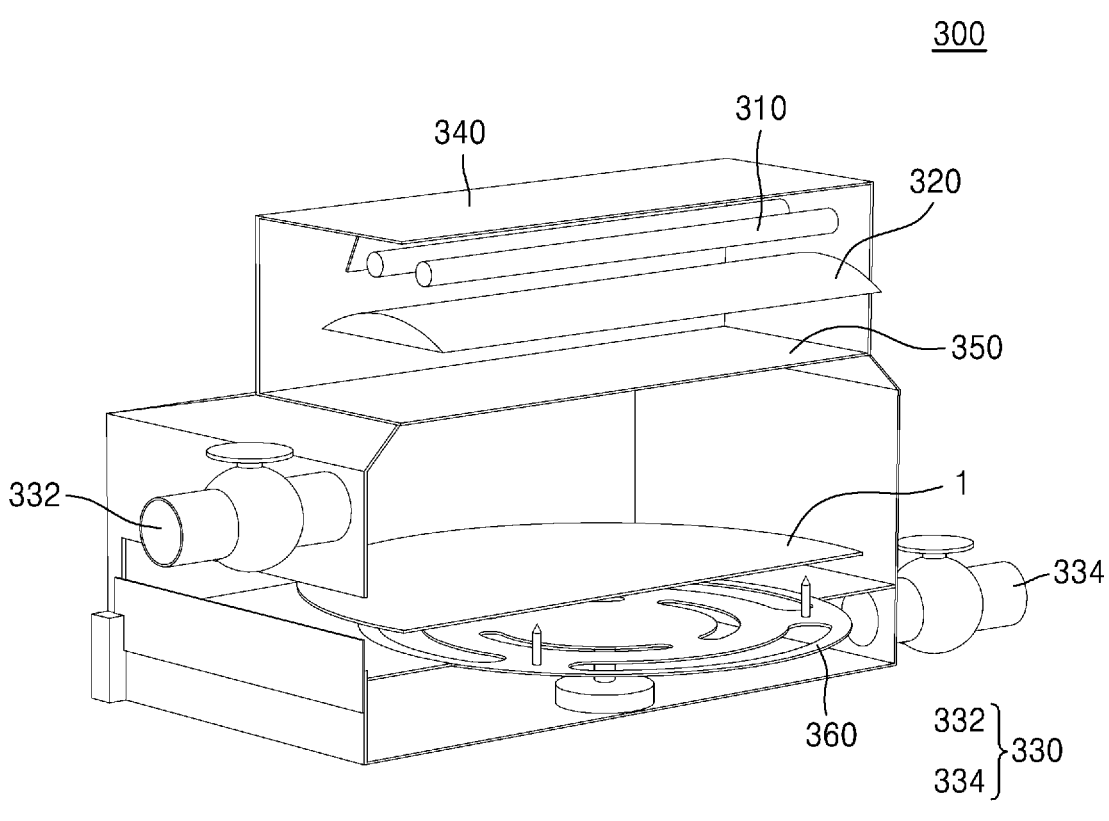
FIGS. 2A and 2B are a perspective view and a cross-sectional view illustrating a light processing chamber according to embodiments.
Figure 2B:
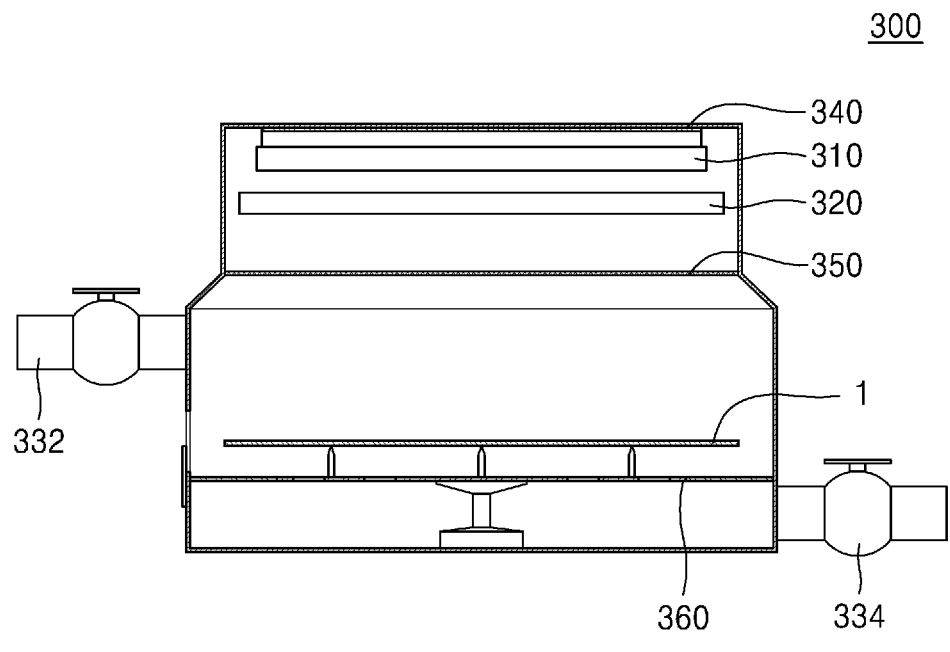

FIGS. 2A and 2B are respectively a perspective view and a cross-sectional view illustrating a light processing chamber according to embodiments.

Referring to FIGS. 2A and 2B, the light processing chamber 300 may correspond to the fifth process chamber CH5 of FIG. 1. The light processing chamber 300 may include a light source unit 310, a reflective plate 340, a substrate support unit 360, a focusing lens 320, a light filter unit 350, a circulation unit 330, a cooling line (not shown), and a refrigerant supply source (not shown).

The light source unit 310 may emit light to the substrate. The light source unit may include a plurality of light sources, and may also be described generally as a light source. Each of the plurality of light sources, which may be described as a light source element, may include any one of a laser, an extreme ultraviolet lamp, a flash lamp, an infrared lamp, and an ultraviolet lamp. In addition, in FIG. 2A, the plurality of light sources of the light source unit 310 are shown in a cylindrical shape, but the embodiments are not limited thereto, and the plurality of light sources of the light source unit 310 may include any one of a cylindrical shape, a circular shape, and a rectangular shape, for example.

The reflective plate 340 may be arranged on the upper part of the light source unit and reflect the light radiated from the light source unit 310 back toward the substrate 1. The reflective plate 340 may be arranged above the light source unit 310 and may be arranged to surround a part of the light source unit 310.

The substrate support unit 360, also described as a substrate support or a substrate support plate, may include a chuck and may support the substrate 1 in an inner space of the light processing chamber 300. In addition, the substrate support unit 360 may rotate the substrate 1 seated on the chuck. The chuck may be one of a plurality of chucks, such that the light processing chamber 300 may include a plurality of chucks.

The focusing lens 320 may be arranged between the light source unit 310 and the substrate support unit 360 and may concentrate light radiated from the light source unit 310 toward the substrate 1. The focusing lens 320 may include a collimate lens or a convex lens.

The light filter unit 350, also described as a light filter, may be formed under the focusing lens and may filter light. In embodiments, the light filter unit 350 may filter the light radiated from the light source unit 310 to any one of infrared, ultraviolet, and extreme ultraviolet wavelength bands. The wavelength of light irradiating the substrate 1 may be determined by the light filter unit 350.

The circulation unit 330 may circulate air in the light processing chamber 300. The circulation unit 330 may be an air circulation system that includes a suction unit 332 (e.g., an intake opening and/or intake fan) for sucking external air into the light processing chamber 300 and an exhaust unit 334 (e.g., an exhaust opening and/or exhaust fan) for exhausting internal air of the light processing chamber 300. The circulation unit 330 may adjust the temperature of the internal space of the light processing chamber 300. In addition, the circulation unit 330 may discharge the waste gas formed in the light processing chamber 300 to the outside of the light processing chamber 300.

The cooling line (not shown) may be arranged adjacent to the light source unit 310 and may cool the light source unit 310. In addition, the cooling line may have an S-shaped line shape or a winding shape. The refrigerant supply source (not shown) may supply cooling water or other cooling liquid to the cooling line.

Figure 3:
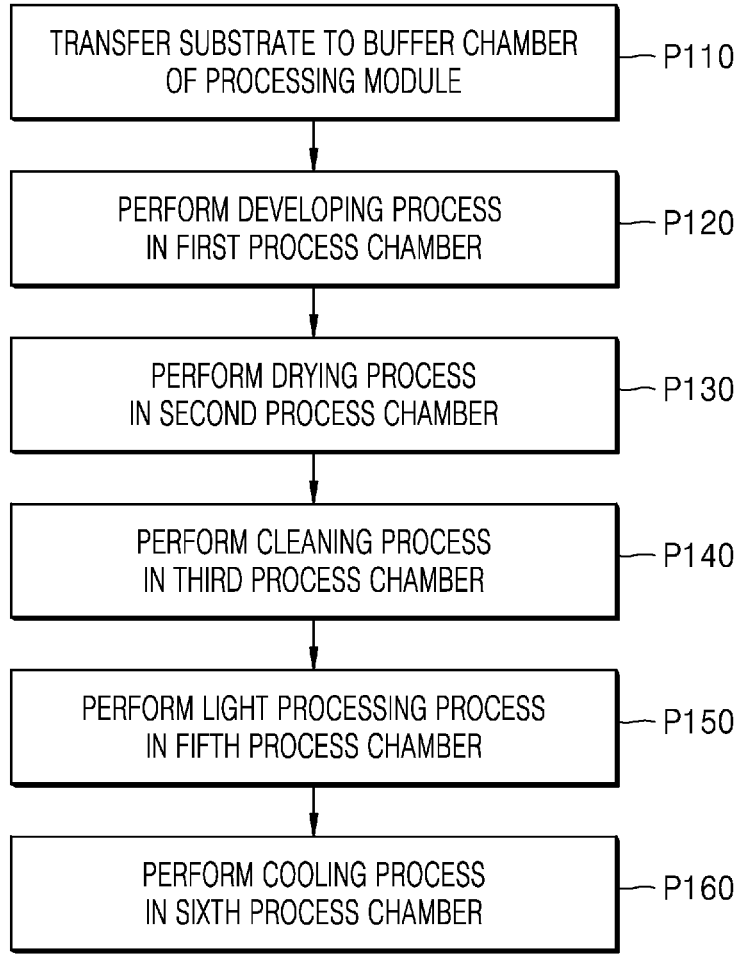
FIG. 3 is a flowchart illustrating a substrate processing method according to embodiments.

FIG. 3 is a flowchart illustrating a substrate processing method according to embodiments. FIGS. 4A to 4F are cross-sectional views illustrating a substrate processing method according to embodiments. FIGS. 5A to 5F are cross-sectional views illustrating a substrate processing method according to embodiments. FIGS. 6A to 6D are cross-sectional views illustrating an oxygen network formation process of a photoresist pattern according to embodiments. Hereinafter, each operation will be described with reference to drawings corresponding to each operation. The substrate processing method of FIGS. 3, 4A to 4F, and 5A to 5F and the oxygen network formation process of FIGS. 6A to 6D will be described together with reference to FIG. 1, but the redundant description in relation to FIG. 1 will be omitted or briefly given. The processing method may be part of a method of manufacturing a semiconductor device, such as a semiconductor memory or logic chip, in which the processing method is one step in a series of deposition, etching, and cleaning steps that form a plurality of layers on a substrate to form an integrated circuit on the substrate.

Figure 5A:
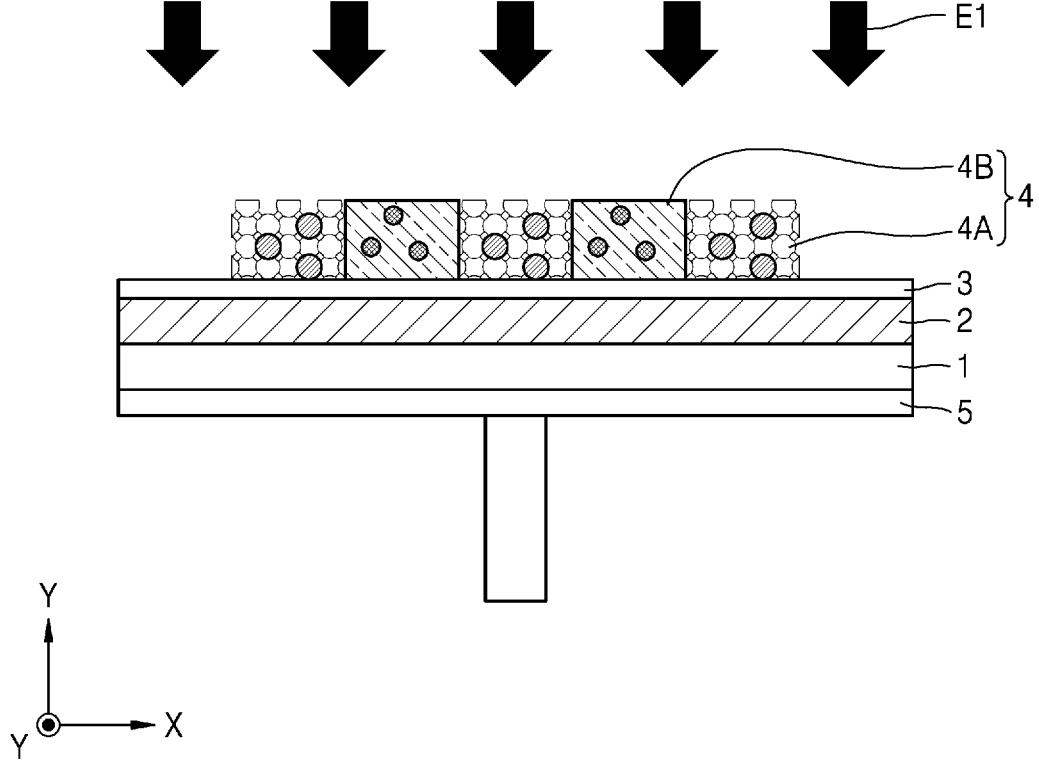
FIGS. 5A to 5F are cross-sectional views illustrating a substrate processing method according to embodiments.

Referring to FIG. 5A, prior to the substrate processing operation, an exposure process for irradiating EUV light on a substrate 1 coated with a photoresist film 4 may be performed. The substrate 1 may be, for example, a silicon (Si) wafer including or formed of crystalline silicon, polycrystalline silicon, or amorphous silicon. Alternatively, the substrate 1 may include or be formed of a semiconductor element such as germanium (Ge), or a compound semiconductor such as silicon carbide (SiC), gallium arsenide (GaAs), indium arsenide (InAs), and indium phosphide (InP). A film-to-be-etched 2, an antireflective film 3, and a photoresist film 4 may be formed on the substrate 1. The film-to-be-etched 2 may be patterned by processes such as plasma etching, reactive ion etching (RIE), and ion beam etching. The antireflective film 3 may prevent total reflection of EUV light in an exposure process. The substrate 1 may be seated on a substrate support unit 5.

In some embodiments, the substrate 1 may have a silicon on insulator (SOI) structure. For example, the substrate 1 may include a buried oxide (BOX) layer. In some embodiments, the substrate 1 may include a well doped with impurities or a structure doped with impurities into a conductive area. In addition, the substrate 1 may have various device isolation structures such as shallow trench isolation (SHI) structures.

The photoresist film 4 may be formed on the substrate 1. In this case, the photoresist film 4 may include an organic photoresist. The photoresist film 4 formed on the substrate 1 may be divided into an exposure part 4A and a non-exposure part 4B by the exposure process. The exposure part 4A exposed to EUV light E1 generates an acid from a photoacid generator, thereby resulting in deprotection of a photosensitive polymer. In contrast, since EUV light E1 is not irradiated onto the non-exposure part 4B, such a chemical reaction does not occur.

Referring to FIGS. 5A and 6A to 6C, when specifically describing the exposure part 4A, the photoresist film includes a central atom 410 and ligands 420, and the ligands

420 may form activation ligands 430 by EUV light, and form an oxygen network 440 together with the activation ligands 430 of the surrounding central atom 410. In this case, not all of the ligands 420 of the exposure part 4A are activated, and some of the ligands 420 of the exposure part 4A may not form the activation ligands 430.

Figure 4A:
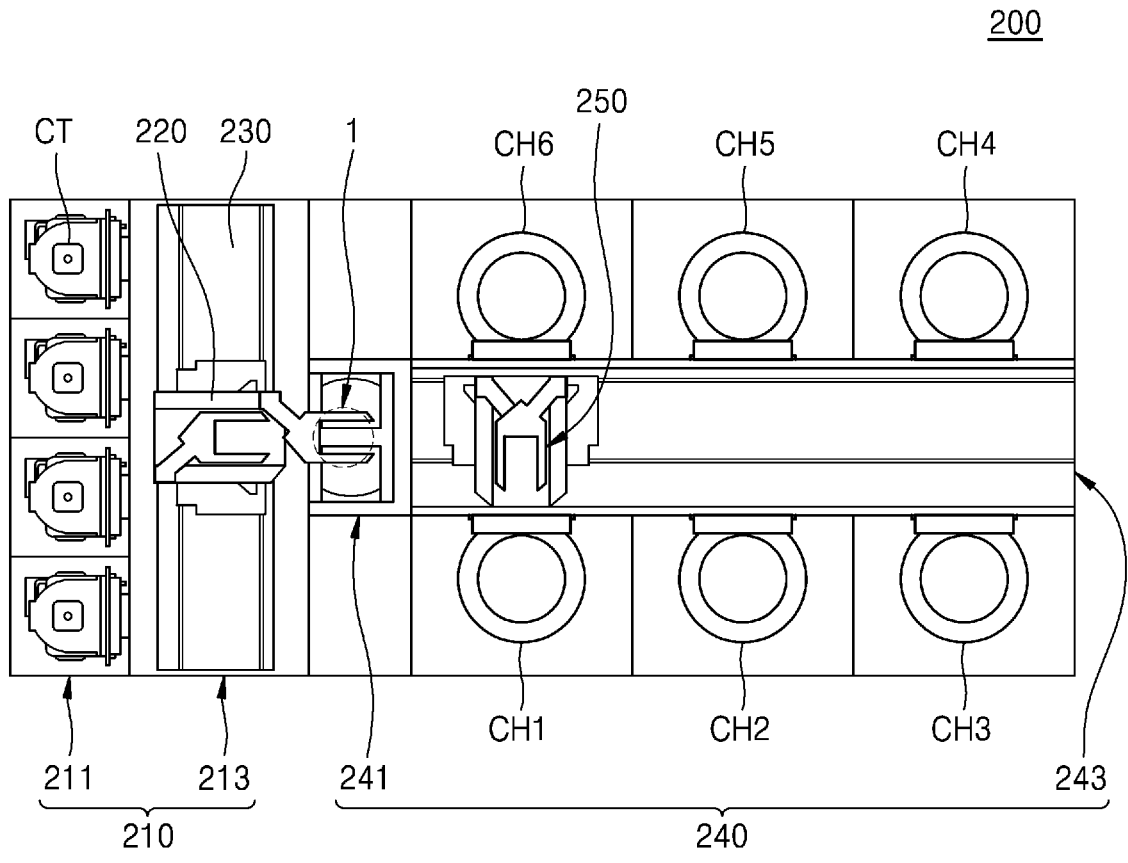
FIGS. 4A to 4F are cross-sectional views illustrating a substrate processing method according to embodiments.
Figure 4A:
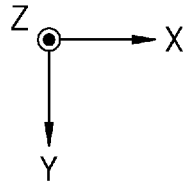

Referring to FIG. 4A, the substrate processing method according to embodiments may transfer the substrate 1 having undergone the exposure process from the index module 210 to the buffer chamber 241 of the processing module 240 (P110 of FIG. 3). In this case, the substrate 1 may be transferred to the buffer chamber 241 by a first hand unit or a second hand unit of the first transfer module 220. The first hand unit may be separately controllable from the second hand unit, and may include a different arm and hand, separately moveable from an arm and hand of the second hand unit.

Figure 4B:
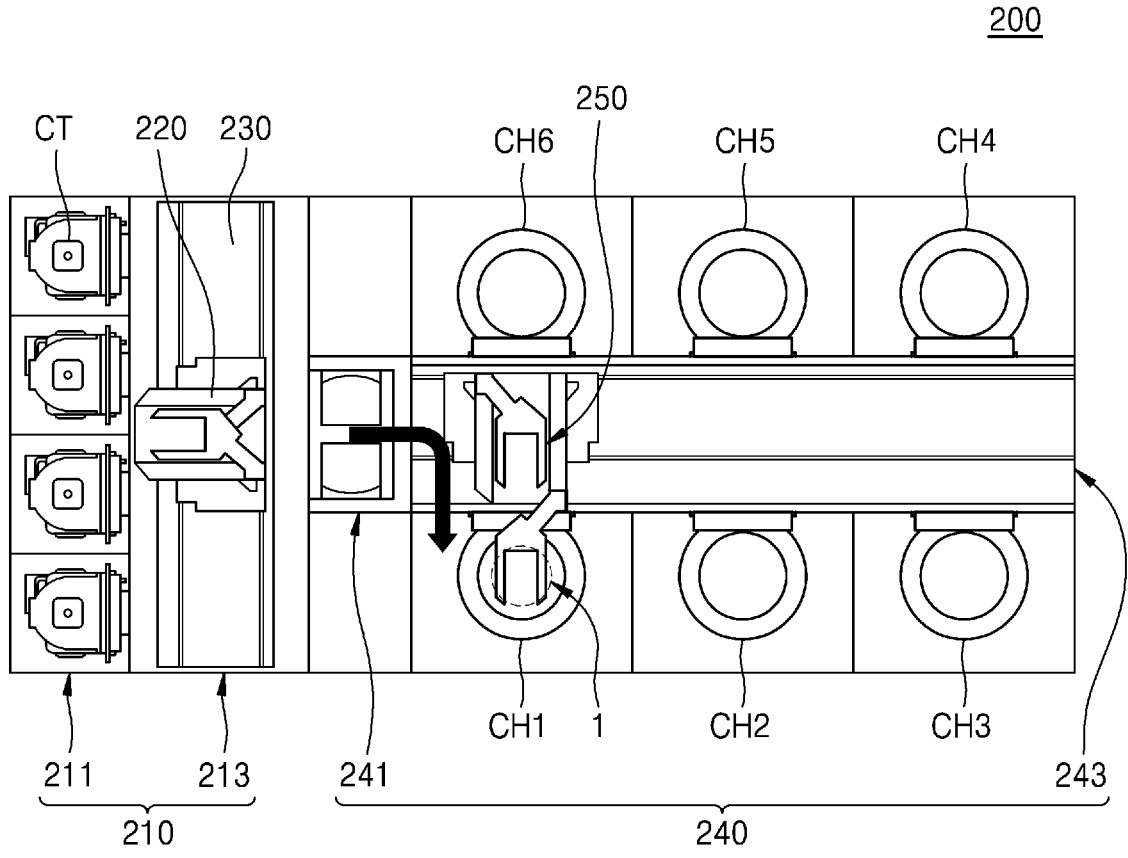
Figure 4B:
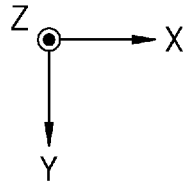
Figure 5B:
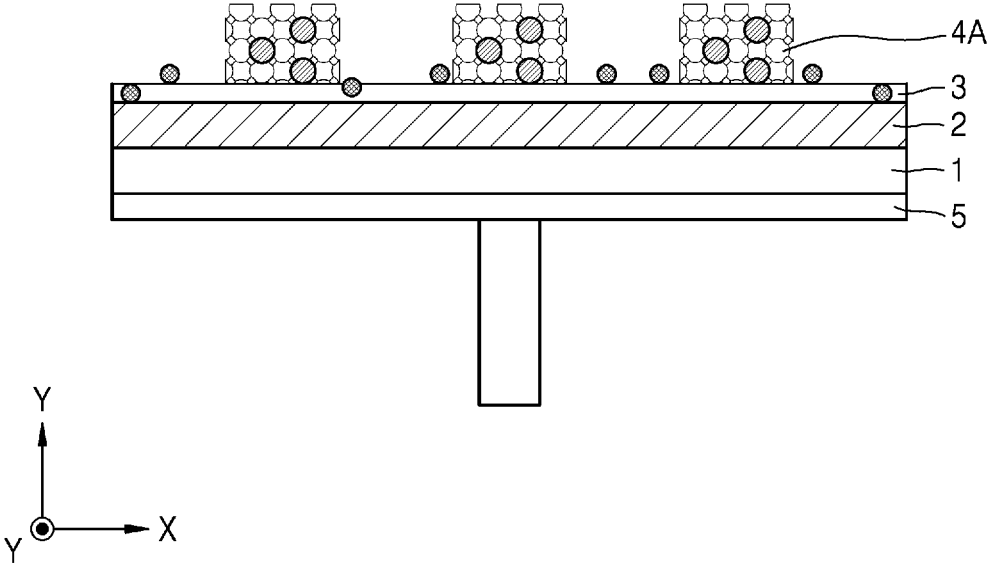

Referring to FIGS. 4B and 5B, after being transferred to the buffer chamber 241, the substrate 1 or W may be loaded from the buffer chamber 241 to the first process chamber CH1 to undergo a developing process (P120 of FIG. 3). In this case, the second transfer module 250 may transfer the substrate 1 from the buffer chamber 241 to the first process chamber CH1 by using the third hand unit of the second transfer module 250. The second transfer module 250 may keep the substrate 1 clean by allowing the third hand unit to transfer the substrate 1 in a state in which the substrate 1 is not contaminated by residue or developer. Here, the non-exposure part 4B of FIG. 5A may be removed by the developing process. However, the embodiments are not limited thereto, and in some other embodiments, the exposure part 4A may be removed instead of the non-exposure part 4B. Materials such as residue and/or developer may remain around the exposure part 4A and the substrate 1 by the developing process. After the non-exposure part 4B is removed, the exposure part 4A may correspond to the photoresist pattern.

Figure 5C:
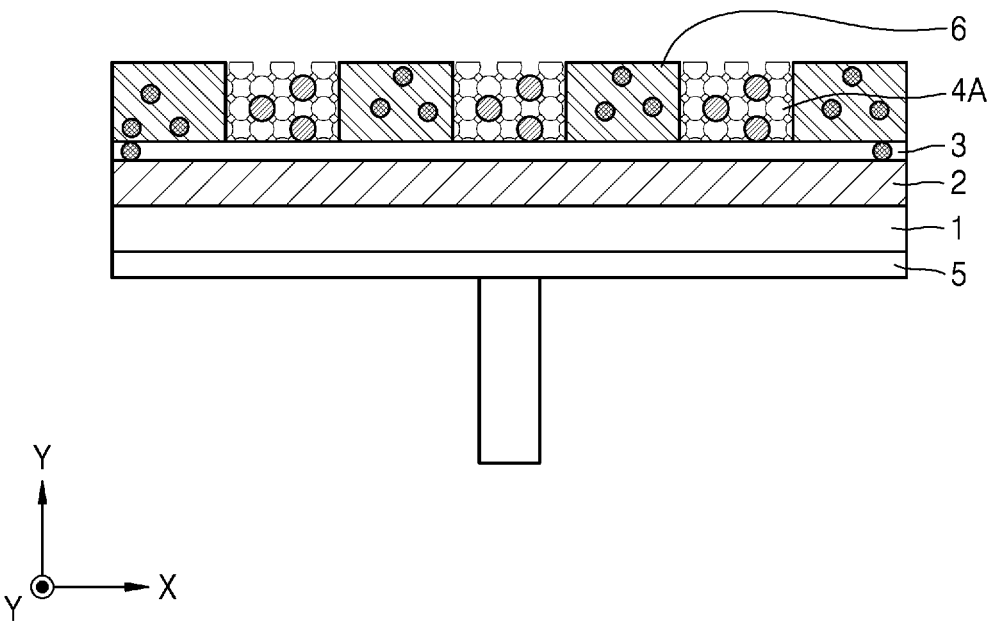

Here, referring to FIG. 5C, after the developing process, a replacement process of replacing the developer of the substrate 1 with a nonpolar organic solvent may be performed in the second process chamber CH2. Here, the replacement solution may include a nonpolar organic solvent. For example, the replacement solution may include n-butyl acetate (n-BA). The developer may be replaced with the replacement solution. For example, the developer may be dissolved into the replacement solution. By replacing the developer with a replacement solution, residue or developer may be efficiently removed in a drying process to be described later.

Figure 4C:
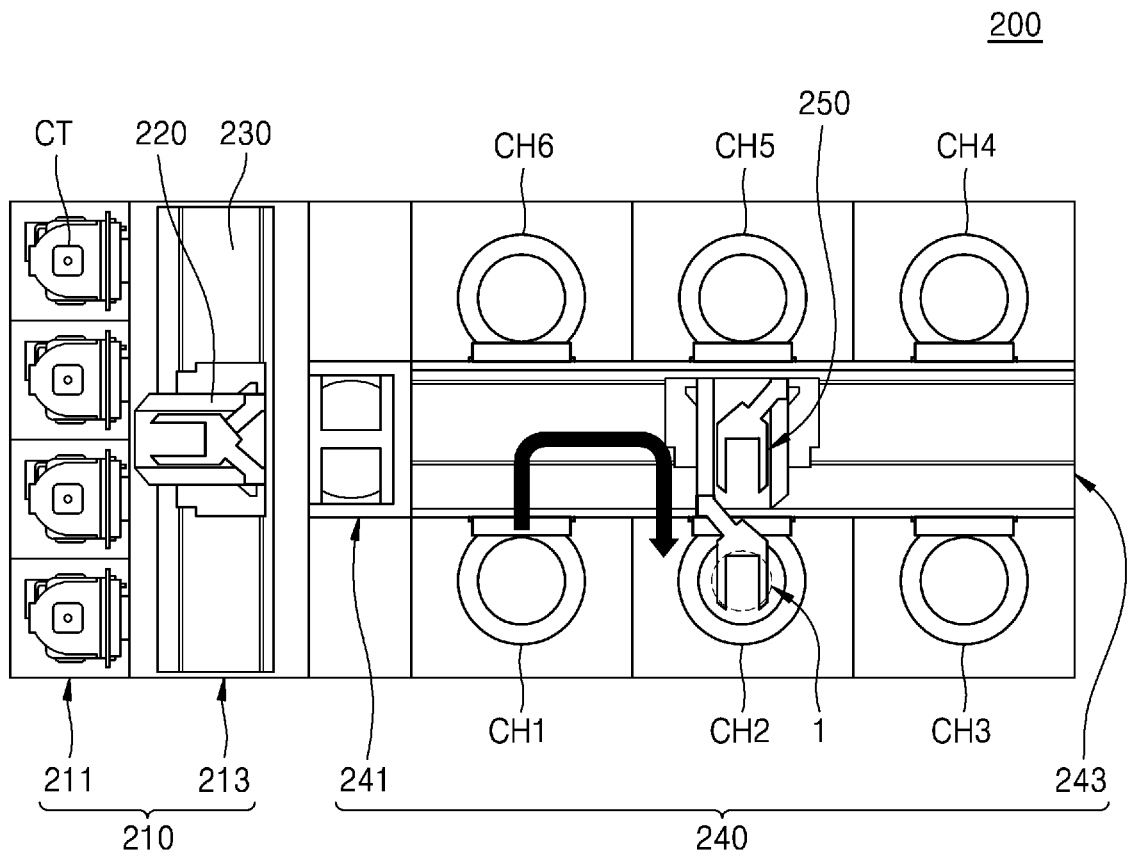
Figure 4C:
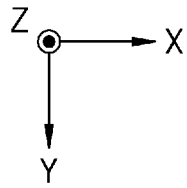

Referring to FIG. 4C, after the developing process and replacement process, the substrate 1 may be loaded into the second process chamber CH2 to undergo a drying process (P130 of FIG. 3). In this case, the second transfer module 250 may unload the substrate 1 from the first process chamber CH1 by using the fourth hand unit of the second transfer module 250, and transfer and load the substrate 1 to the second process chamber CH2. In this case, the drying process may be performed using a supercritical fluid.

Figure 4D:
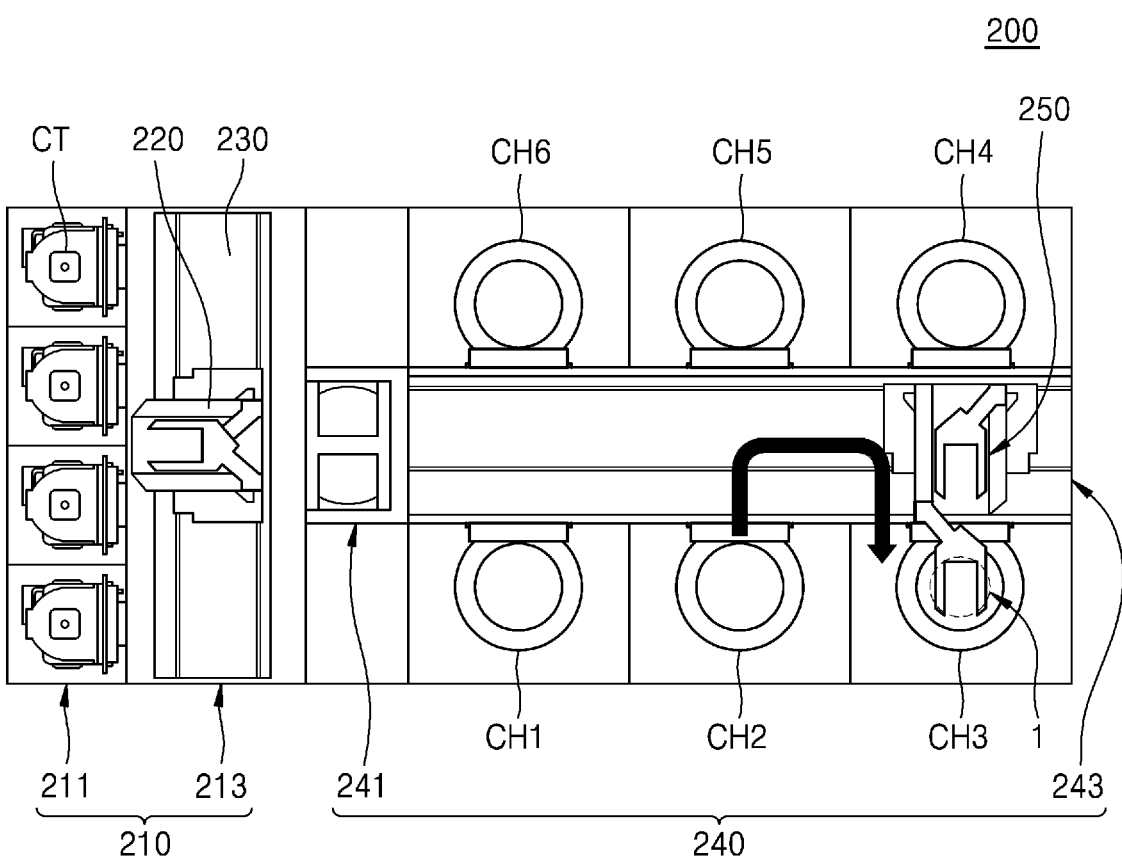
Figure 4D:
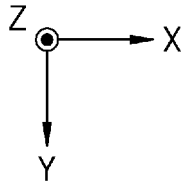
Figure 5D:
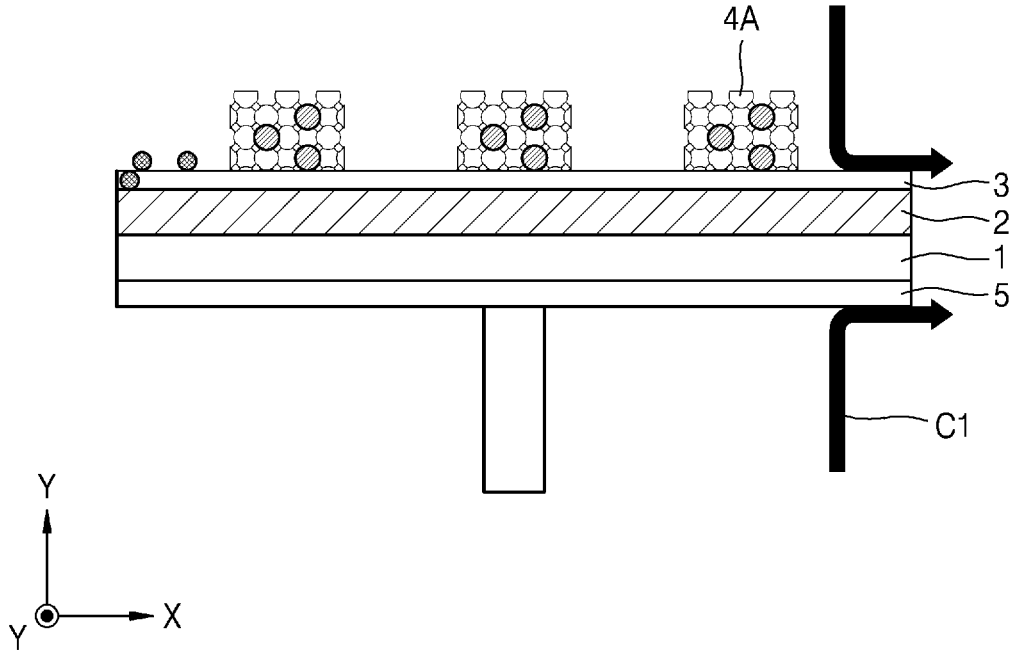

Referring to FIGS. 4D and 5D, after the drying process, the substrate 1 may be loaded into the third process chamber CH3 to undergo the cleaning process (P140 of FIG. 3). The cleaning process may be performed using a rinse solution. As described above with reference to FIG. 1, the rinse solution may include at least one of a nonpolar organic solvent and an acidic solution. The second transfer module 250 may unload the substrate 1 from the second process chamber CH2 by using the fourth hand unit of the second transfer module 250, and transfer and load the substrate 1 to the third process chamber CH3. The third process chamber CH3 may primarily supply the rinse solution to an edge area C1 of the substrate 1. In this case, the edge area may include an upper edge area and a lower edge area of the substrate 1.

Figure 5E:
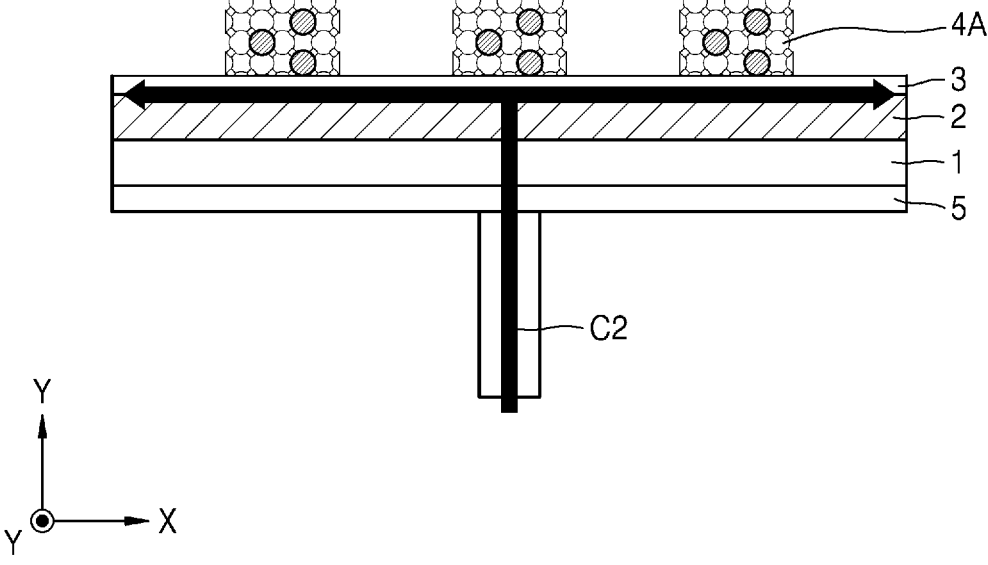

Referring to FIG. 5E, in the drying process, the third process chamber CH3 may secondarily supply the rinse solution to a rear surface area C2 of the substrate 1. As described above, the cleaning process using the rinse solution is performed on the substrate 1 having undergone the developing process and the drying process, so that the residue and/or the developer remaining on the substrate 1 may be efficiently removed.

Figure 4E:
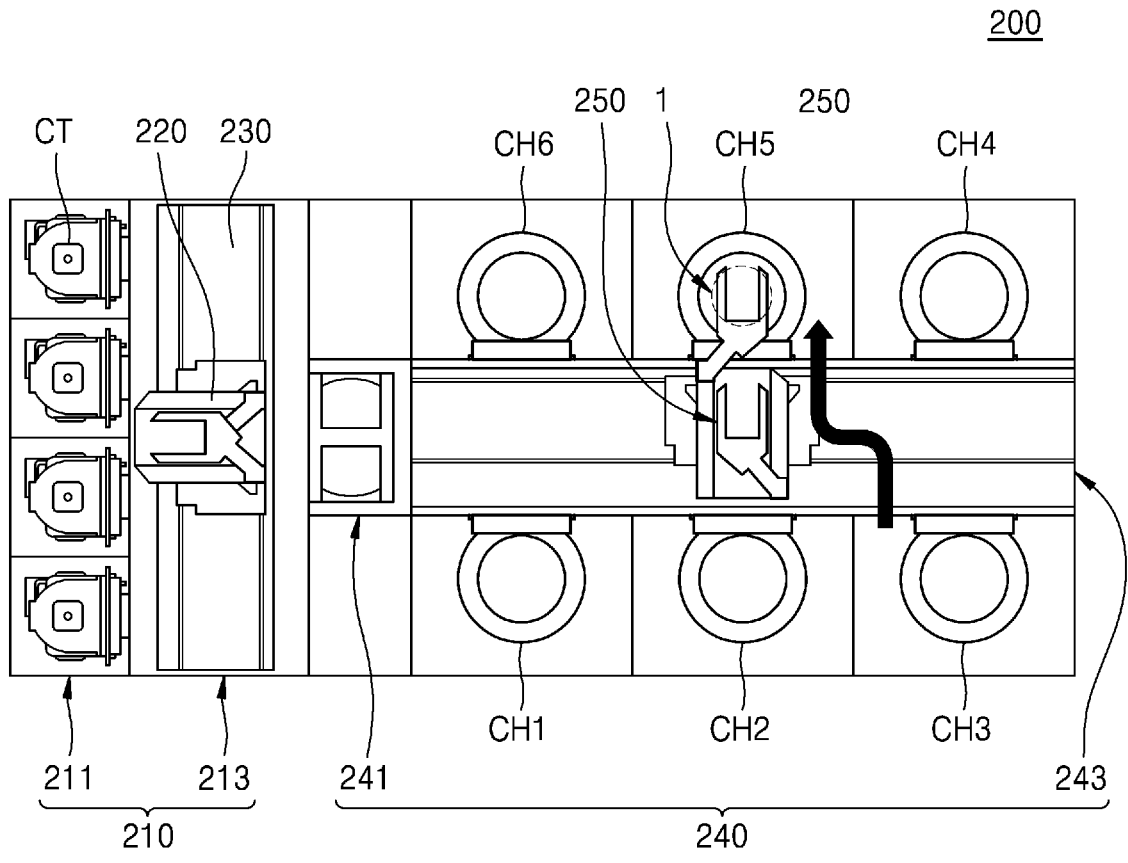
Figure 4E:
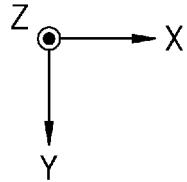
Figure 5F:
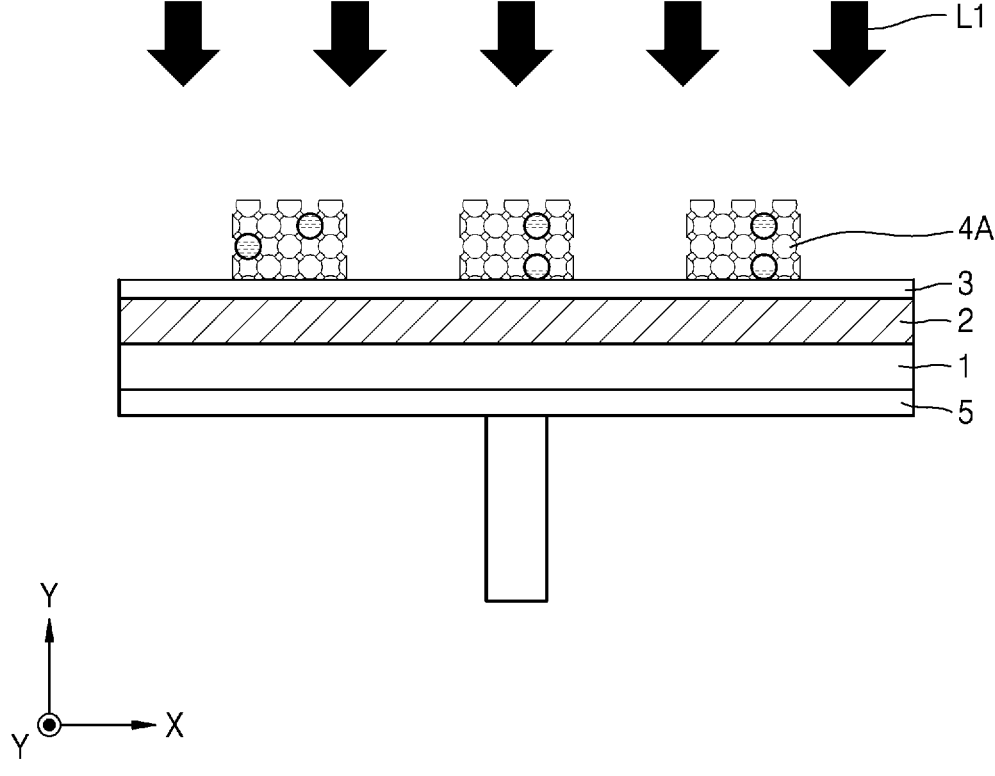
Figure 6A:
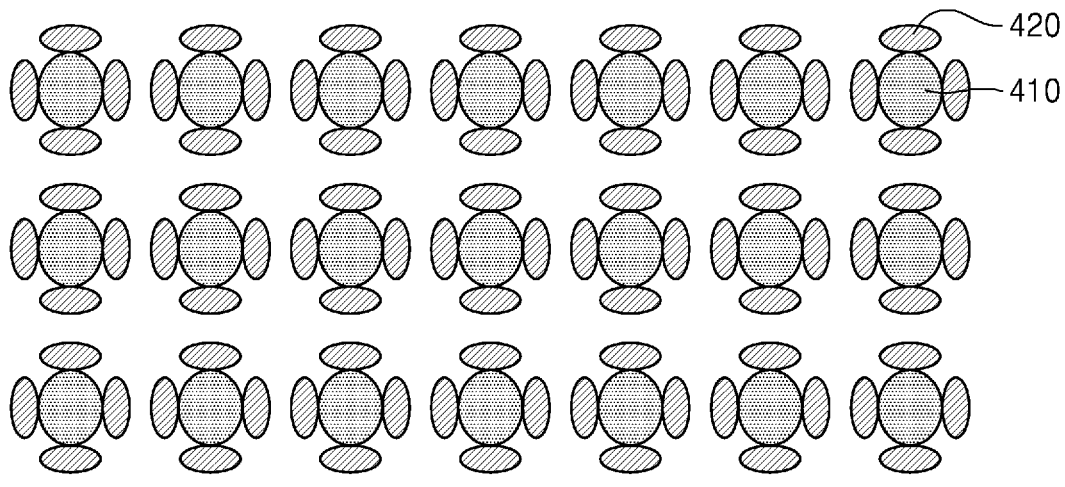
FIGS. 6A to 6D are cross-sectional views illustrating an oxygen network formation process of a photoresist pattern according to embodiments.
Figure 6B:
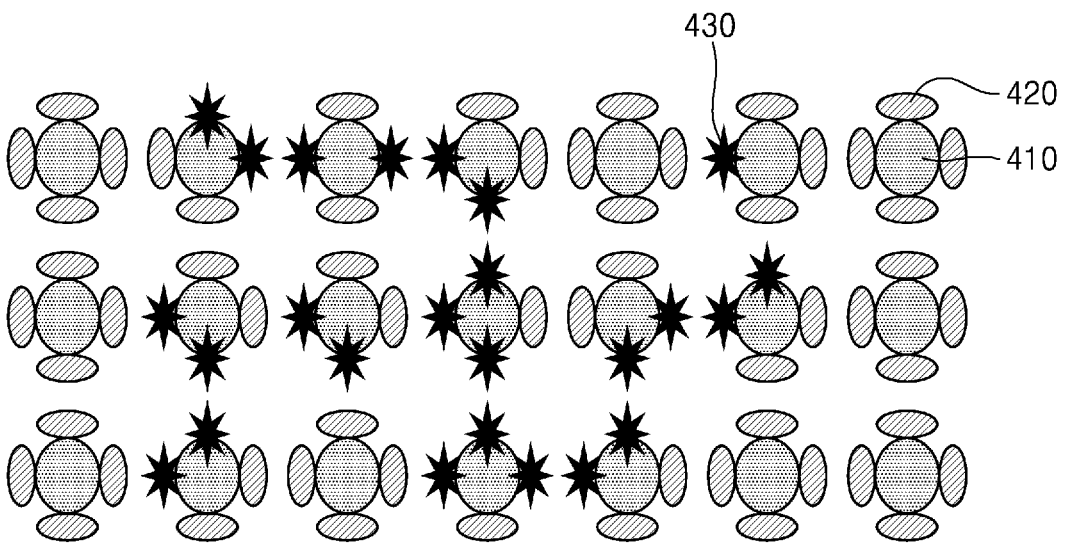
Figure 6C:
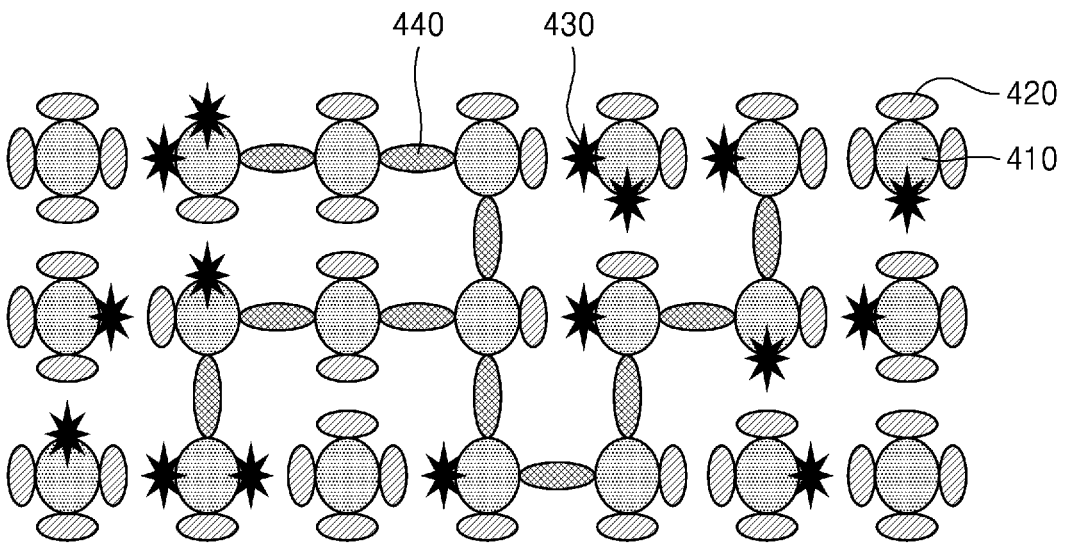
Figure 6D:
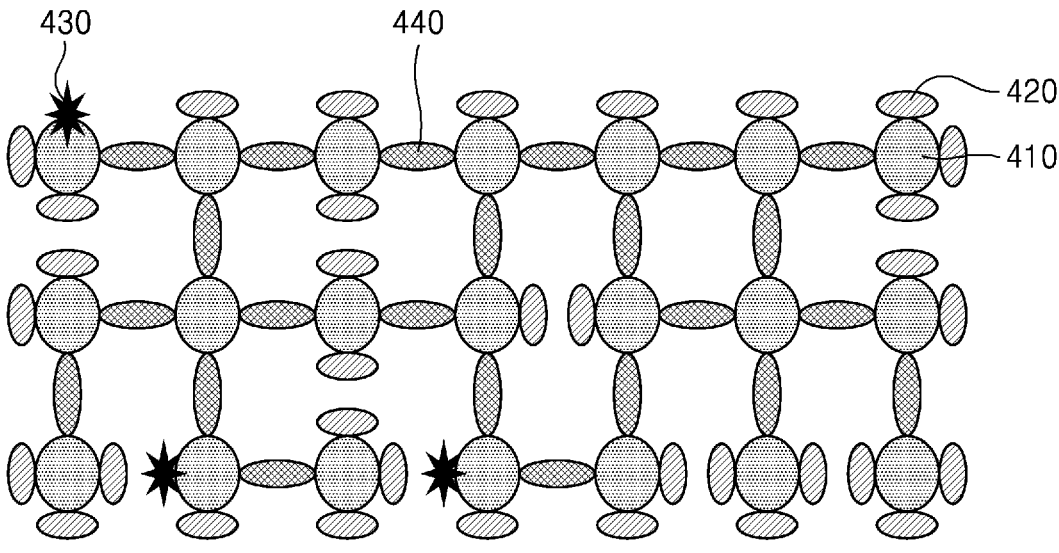

Referring to FIGS. 4E, 5F, and 6D, after the cleaning process, the substrate 1 may be loaded into the fifth process chamber CH5 to undergo a light processing process (P150 of FIG. 3). Here, the second transfer module 250 may unload the substrate 1 from the fourth process chamber CH4 by using the third hand unit of the second transfer module 250, and transfer and load the substrate 1 to the fifth process chamber CH5. In this case, the light processing process may change deactivation ligands that are not activated by the EUV light to activation ligands 430 by the light L1 emitted by the light source unit, and the activation ligands 430 may form an oxygen network 440. The oxygen network 440 in the photoresist pattern on the substrate 1 may be formed more after performing the light processing process than before performing the light processing process. Accordingly, the substrate processing method and the substrate processing apparatus according to the embodiments may prevent the collapse of the photoresist pattern.

In accordance with some other embodiments, the substrate 1 may be transferred to the fourth process chamber CH4 before being transferred to the fifth process chamber (CH5), to undergo a baking process. In this case, the second transfer module 250 may unload the substrate 1 from the third process chamber CH3 by using the third hand unit of the second transfer module 250, and transfer and load the substrate 1 to the fourth process chamber CH4. After the baking process is performed on the substrate 1, the second transfer module 250 may unload the substrate 1 from the fourth process chamber CH4 by using the third hand unit of the second transfer module 250, and transfer and load the substrate 1 to the fifth process chamber CH5. Thereafter, a light processing process may be performed on the substrate 1 on which the baking process has been performed.

In addition, according to some other embodiments, the fifth process chamber CH5 may perform the baking process on the substrate 1 by using a plurality of light sources of the light source unit 310. In this case, the fifth process chamber CH5 may perform a light processing process and/or baking process on the substrate 1 by adjusting the wavelength of light by the light filter unit 350. In this case, the substrate 1 may not be transferred to the fourth process chamber CH4.

After the light processing process is performed, the substrate may be loaded into the sixth process chamber CH6 to undergo a cooling process (P160). The second transfer module 250 may unload the substrate 1 from the fifth process chamber CH5 by using the fourth hand unit of the second transfer module 250, and transfer and load the substrate 1 to the sixth process chamber CH6. In this case, the temperature of the substrate 1 heated by the cooling process may be lowered.

Figure 4F:
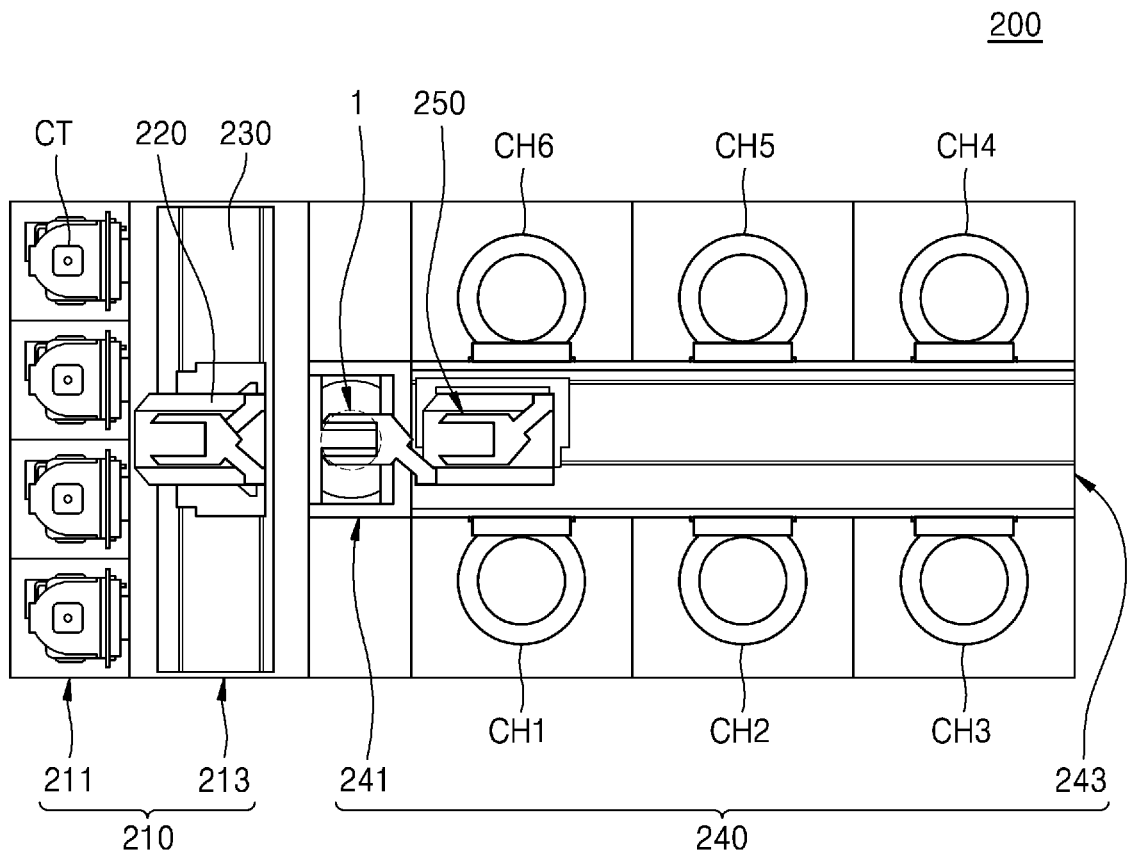
Figure 4F:
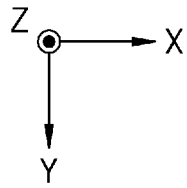

Referring to FIG. 4F, after the cooling process, the substrate 1 may be transferred from the sixth process chamber CH6 to the buffer chamber 241. In this case, the transfer of the substrate 1 may be performed by the third hand unit of the second transfer module 250.

Figure 7:
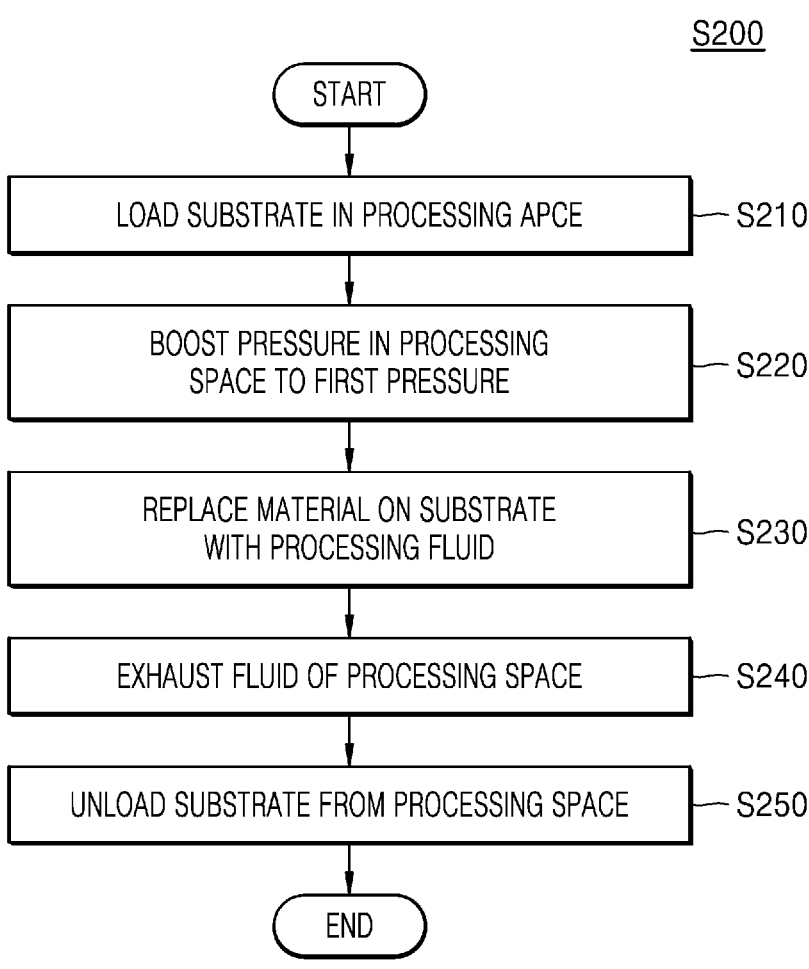
FIG. 7 is a flowchart illustrating a substrate processing method according to embodiments.
Figure 8:
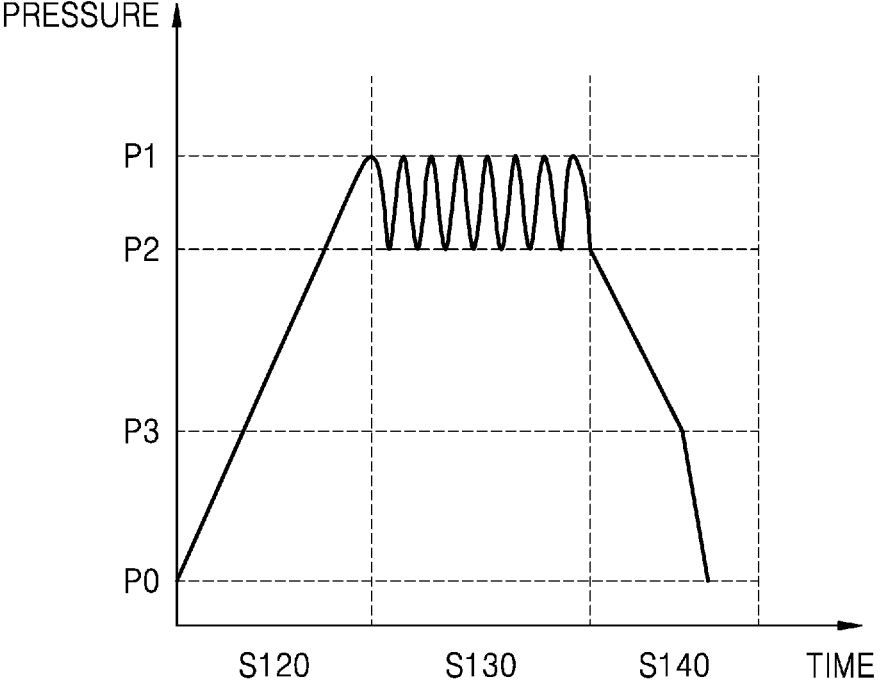
FIG. 8 is a graph illustrating pressure of a processing space while processing a substrate.

Further processes may then be formed on the substrate to form a plurality of semiconductor devices on the substrate, and the semiconductor devices may be subsequently separated to form individual semiconductor chips FIG. 7 is a flowchart illustrating a substrate processing method according to embodiments. FIG. 8 is a graph illustrating pressure of a processing space while processing a substrate. Although the flowchart of FIG. 7 and the graph of FIG. 8 will be described with reference to FIG. 1, the redundant description in relation to FIG. 1 will be omitted or briefly given.

Referring to FIGS. 7 and 8, here, the processing container may correspond to a second process chamber CH2 in which a drying process is performed. In the substrate processing method S200 according to embodiments, first, the substrate 1 is loaded into the processing space of the processing container (S210). While the substrate 1 is loaded into the processing space, the processing container may be located in an open position. The substrate 1 may be seated on the substrate support. The substrate may have formed thereon a pattern, for example, formed of a photoresist with an exposure part and a non-exposure part. When the substrate 1 is loaded on the substrate support, a processing container may switch from an open position to a closed position so that a processing space is sealed from the outside of the processing container.

When the loading operation of the substrate 1 is completed, a drying process is performed on the substrate 1. The drying process for the substrate 1 may include an operation of boosting the pressure of the processing space to a target pressure (S220), an operation of replacing or removing the material on the substrate 1 using a processing fluid (PF) (S230), and an operation of exhausting the waste fluid of the processing space (S240).

The operation S220 may include supplying a processing fluid in a supercritical state to the processing space to fill the processing space with a supercritical fluid. In embodiments, the fluid supply device 130 may supply a supercritical processing fluid to the processing space to boost the pressure of the processing space from an initial pressure P0 similar to atmospheric pressure to a first pressure P1. In embodiments, the first pressure P1 is higher than the threshold pressure of the processing fluid (PF), and may be, for example, about 150 bar.

In embodiments, operation S220 may include a first supply operation of supplying the processing fluid of a first temperature to a lower portion of the processing space through a first supply pipe and a second supply operation of supplying the processing fluid of a second temperature to an upper portion of the processing space through a second supply pipe. In the first supply operation, the first temperature of the processing fluid may be between about 35° C. and about 70° C. In the second supply operation, the second temperature of the processing fluid may be higher than the first temperature. In the second supply operation, the second temperature of the processing fluid may be between about 70° C. and about 120° C. The first supply operation may be performed until the pressure of the processing space reaches a target intermediate pressure between the initial pressure P0 and the first pressure P1, and for example, the target intermediate pressure may be between about 75 bar and about 90 bar. When the pressure of the processing space reaches the target intermediate pressure through the first supply operation, the second supply operation may be performed. The second supply operation may be performed until the pressure of the processing space reaches the first pressure P1.

In operation S230, the material (e.g., the developer and/or rinse solution) on the substrate 1 may be mixed (or replaced) with the processing fluid (PF), and the mixed fluid may be discharged through an exhaust pipe.

The operation S230 may include a decompression process of decompressing the pressure of the processing space from the first pressure P1 to a second pressure P2 that is lower than the first pressure P1, and a boosting process of boosting the pressure of the processing space from the second pressure P2 to the first pressure P1. The second pressure P2 may be between about 75 bar and about 90 bar. The operation S230 may include alternately repeating the decompression process and the boosting process at least two times. The decompression process may include exhausting waste fluid in the processing space through an exhaust device. The boosting process may include supplying the processing fluid PF of the second temperature to the upper portion of the processing space through the second supply pipe.

In operation S240, the exhaust device may exhaust the waste fluid in the processing space to decompress the pressure of the processing space to the initial pressure P0. Here, the operation of decompressing the pressure of the processing space may be divided into two operations. First, a low-speed exhaust process (slow-speed decompression) may be performed to decompress the pressure in the processing space to a third pressure P3, and a high-speed exhaust process (high-speed decompression) may be performed to decompress the pressure in the processing space to the initial pressure P0 similar to atmospheric pressure.

When the drying process of the substrate 1 is completed, the processing container is switched from the closed position to the open position, and the substrate 1 may be unloaded from the processing space (S250).

While the inventive concept has been particularly shown and described with reference to embodiments thereof, it will be understood that various changes in form and details may be made therein without departing from the spirit and scope of the following claims.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

What is claimed is:

1. A substrate processing apparatus comprising:
a load port on which a container in which a substrate is accommodated is placed;
a first transfer module and a second transfer module for loading and unloading the substrate; and
a processing module that is connected to the load port and includes a plurality of process chambers that process the substrate, wherein:

12 one of the plurality of process chambers includes a light processing chamber configured to radiate light to a photoresist pattern of the substrate to cure the photoresist pattern, and
the first transfer module is configured to transfer the substrate between the load port and the processing module, and the second transfer module is configured to transfer the substrate between the plurality of process chambers in the processing module, wherein
one of the plurality of process chambers includes a first process chamber configured to form the photoresist pattern from a photoresist membrane on the substrate by supplying a developer to the substrate to perform a developing process and a replacement process, and
the replacement process includes, after performing the developing process, replacing the developer with a nonpolar solvent.

2. The substrate processing apparatus of claim 1, wherein the light processing chamber comprises:
a light source unit configured to radiate light to the substrate;
a reflective plate arranged on an upper portion of the light source unit and configured to reflect the light emitted from the light source unit;
a substrate support configured to support the substrate in an inner space of the light processing chamber;
a focusing lens arranged between the light source unit and the substrate support and condensing the light radiated from the light source unit toward the substrate;
a light filter formed under the focusing lens and filtering the light; and
a circulation unit configured to circulate air in the light processing chamber.

3. The substrate processing apparatus of claim 2, wherein the light source unit comprises a plurality of light sources, wherein each of the plurality of light sources comprises any one of a laser, an extreme ultraviolet lamp, a flash lamp, an infrared lamp, and an ultraviolet lamp, and is formed in any one of a cylindrical shape, a circular shape, and a rectangular shape.

4. The substrate processing apparatus of claim 2, wherein the light processing chamber comprises:
a cooling line placed adjacent to the light source unit; and
a refrigerant supply source for supplying cooling liquid to the cooling line, wherein
the cooling line is configured to cool a temperature of the light source unit.

5. The substrate processing apparatus of claim 2, wherein the circulation unit comprises:
a suction unit for sucking external air into the light processing chamber; and
an exhaust unit for exhausting internal air of the light processing chamber, and
wherein the circulation unit adjusts temperature of the light processing chamber by using the suction unit and the exhaust unit.

6. The substrate processing apparatus of claim 1, wherein:
the plurality of process chambers include the first process chamber, a second process chamber, a third process chamber, a fourth process chamber, a fifth process chamber, and a sixth process chamber, wherein:
the first process chamber is configured to form the photoresist pattern from the photoresist membrane of the substrate by supplying the developer to the substrate to perform the developing process and the replacement process, the second process chamber is configured to perform a drying process using a supercritical fluid, the third process chamber is configured to perform a cleaning process using a rinse solution on the photoresist pattern on the substrate, the fourth process chamber is configured to perform a baking process of curing the substrate, the fifth process chamber is the light processing chamber, and the sixth process chamber is configured to perform a cooling process of cooling the substrate processed in the fifth process chamber.

7. The substrate processing apparatus of claim 6, wherein;

the first transfer module includes a first hand unit and a second hand unit, and the second transfer module includes a third hand unit and a fourth hand unit, and the second transfer module transfers, loads, and unloads the substrate by using the third hand unit of the second transfer module when the substrate is transferred from the fourth process chamber to the sixth process chamber.

8. The substrate processing apparatus of claim 7, wherein the second transfer module transfers, loads, and unloads the substrate by using the fourth hand unit of the second transfer module when the substrate is transferred from the first process chamber to the third process chamber.

9. The substrate processing apparatus of claim 6, wherein the second transfer module is configured to transfer the substrate to the first process chamber and the second process chamber, and to transfer, to the third process chamber, the substrate on which the drying process has been performed in the second process chamber, and the third process chamber primarily supplies the rinse solution to an edge area of the substrate on the photoresist pattern of the substrate on which the drying process has been performed, and secondarily supplies the rinse solution to a rear area of the substrate.

10. The substrate processing apparatus of claim 1, wherein the first transfer module includes a first hand unit and a second hand unit, and the second transfer module includes a third hand unit and a fourth hand unit, and wherein the processing module comprises a buffer chamber, and the first transfer module transfers the substrate from the load port to the buffer chamber by using the first hand unit or the second hand unit of the first transfer module.

11. A substrate processing apparatus comprising:

a load port configured to receive a container in which a substrate is accommodated, a first transfer module and a second transfer module for loading and unloading the substrate, and a processing module that is connected to the load port and includes a plurality of process chambers that process the substrate, wherein:

the plurality of process chambers includes a first process chamber, a second process chamber, a third process chamber, a fourth process chamber, a fifth process chamber, and a sixth process chamber, wherein:

the first process chamber is configured to form a photoresist pattern from a photoresist membrane of the substrate by supplying a developer to the substrate to perform a developing process and a replacement process, the second process chamber is configured to perform a drying process using a supercritical fluid, the third process chamber is configured to perform a cleaning process in which a rinse process is performed, the fourth process chamber is configured to perform a baking process of curing the substrate, the fifth process chamber is configured to perform a light processing process of curing the photoresist pattern by radiating light to the substrate, the sixth process chamber is configured to perform a cooling process of cooling the substrate processed in the fifth process chamber, the first transfer module is configured to transfer the substrate between the load port and the processing module, the second transfer module is configured to transfer the substrate between the plurality of process chambers in the processing module, and the first transfer module includes at least a first hand unit, and the second transfer module includes at least a second hand unit.

12. The substrate processing apparatus of claim 11, wherein the fifth process chamber comprises:

a plurality of light sources for radiating light to the substrate;

a reflective plate arranged on an upper portion of the plurality of light sources and configured to reflect the light emitted from the plurality of light sources;

a substrate support unit for supporting the substrate in an inner space of the fifth process chamber;

a focusing lens arranged between the plurality of light sources and the substrate support unit and condensing the light radiated from the plurality of light sources toward the substrate;

a light filter formed under the focusing lens and filtering the light; and a circulation unit for circulating air in the fifth process chamber, wherein the plurality of light sources comprise any one of a laser, an extreme ultraviolet lamp, a flash lamp, an infrared lamp, and an ultraviolet lamp, and are formed in any one of a cylindrical shape, a circular shape, and a rectangular shape.

13. The substrate processing apparatus of claim 12, wherein the fifth process chamber comprises:

a cooling line arranged adjacent to the plurality of light sources and cooling the plurality of light sources; and a refrigerant supply source for supplying cooling liquid to the cooling line, wherein the circulation unit comprises:

a suction unit for sucking external air into the fifth processing chamber; and an exhaust unit for exhausting internal air of the fifth processing chamber, and the circulation unit is configured to adjust temperature of the fifth processing chamber by using the suction unit and the exhaust unit.

14. The substrate processing apparatus of claim 12, wherein the light filter filters the light radiated from the plurality of light sources into any one wavelength band from among infrared rays, ultraviolet rays, and extreme ultraviolet rays.

15. The substrate processing apparatus of claim 11, wherein:

the substrate is transferred, loaded, and unloaded by using the second hand unit of the second transfer module when the substrate is transferred from the fourth process chamber to the sixth process chamber, and the substrate is transferred, loaded, and unloaded by using a third hand unit of the second transfer module when the substrate is transferred from the first process chamber to the third process chamber.

16. The substrate processing apparatus of claim 11, wherein the third process chamber is configured to supply a rinse solution to the substrate, wherein:

the rinse solution comprises a mixture of at least one of propylene glycol monomethyl ether acetate (PGMEA), propylene glycol methyl ether (PGME), n-butyl acetate (n-BA), 2-heptanone (MAK), methyl ethyl ketone (MEK), and ethyl pyruvate (EP) and at least one of acetic acid and HF.

17. A method of manufacturing a semiconductor device, comprising:

transferring a substrate on which an exposure process has been performed to a buffer chamber of a processing module;

performing a developing process including loading the substrate from the buffer chamber to a first process chamber;

performing a drying process including loading the substrate in a second process chamber after the developing process;

performing a cleaning process including loading the substrate in a third process chamber after the drying process;

performing a light processing process including loading the substrate in a fifth process chamber after the cleaning process; and performing a cooling process including loading the substrate in a sixth process chamber after the light processing process is performed, wherein:

the cleaning process cleans the substrate using a rinse solution on an edge area of the substrate and a rear area of the substrate.

18. The method of claim 17, wherein:

the transfer of the substrate to the buffer chamber is performed by a first transfer module, and the transfer of the substrate between the first process chamber and the sixth process chamber is performed by a second transfer module.

19. The method of claim 18, wherein the first transfer module includes a first hand unit and a second hand unit, and the second transfer module includes a third hand unit and a fourth hand unit.

20. The method of claim 17, wherein:

the performing of a developing process by loading the substrate from the buffer chamber to a first process chamber comprises, after performing a developing process of supplying a developer to the substrate, performing a replacement process of replacing the developer with a nonpolar solvent.

* * * * *